United States Patent
Dark

(10) Patent No.: US 12,350,687 B1
(45) Date of Patent: Jul. 8, 2025

(54) SYSTEM FOR IN SITU TEMPERATURE CONTROL DURING CENTRIFUGE TESTING

(71) Applicant: Honeywell Federal Manufacturing & Technologies, LLC, Kansas City, MO (US)

(72) Inventor: Phillip Ryan Dark, Kansas City, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 917 days.

(21) Appl. No.: 17/519,224

(22) Filed: Nov. 4, 2021

(51) Int. Cl.
*B04B 15/02* (2006.01)
*B04B 7/02* (2006.01)

(52) U.S. Cl.
CPC ............... *B04B 15/02* (2013.01); *B04B 7/02* (2013.01)

(58) Field of Classification Search
CPC .................................. B04B 15/02; B04B 7/02
See application file for complete search history.

(56) References Cited

U.S. PATENT DOCUMENTS

2020/0070179 A1* 3/2020 Hakimuddin ............. B04B 7/00

FOREIGN PATENT DOCUMENTS

| CN | 103270240 A | * | 8/2013 | ............. E21B 43/20 |
| KR | 100298147 B1 | * | 11/2001 | ......... G01N 21/3577 |

* cited by examiner

*Primary Examiner* — Amber R Orlando
*Assistant Examiner* — Shuyi S. Liu
(74) *Attorney, Agent, or Firm* — Hovey Williams LLP

(57) ABSTRACT

A system for controlling the test temperature of a unit-under-test inside a centrifuge while minimizing the exposure of attendant testing equipment to the test temperature. A barrier housing is emplaced around the unit-under-test to create a close test environment within which the test temperature can be achieved and maintained by the introduction of a thermal medium. The testing equipment is located on an opposite side of the barrier housing and outside of the close test environment but still within the centrifuge. A fixture negotiates the thermal medium from outside the centrifuge into the close test environment. The barrier housing may be an insulated clamshell housing which opens to fit around the unit-under-test and then closes to create the close test environment. The fixture may include a rotary joint in which the thermal medium moves into a central axis of the centrifuge, through a gimbal, and into the close test environment.

21 Claims, 2 Drawing Sheets

US 12,350,687 B1

SYSTEM FOR IN SITU TEMPERATURE CONTROL DURING CENTRIFUGE TESTING

STATEMENT REGARDING FEDERALLY-SPONSORED RESEARCH OR DEVELOPMENT

This invention was made with Government support under Contract No. DE-NA-0002839 awarded by the United States Department of Energy/National Nuclear Security Administration. The Government has certain rights in the invention.

FIELD

The present invention relates to systems and methods for controlling conditions in test environments, and more particularly, embodiments concern a system for controlling the test temperature of a unit-under-test inside a centrifuge while minimizing the exposure of attendant testing equipment to the test temperature.

BACKGROUND

It is sometimes desirable to control the test temperature or other conditions of a unit-under test (UUT) undergoing testing within a centrifuge or other test environment. Existing solutions include locating thermal platforms (i.e., hot or cold plates) within the test environment and employing blow-by systems (i.e., air blowers) in the test environment. However, it is also desirable to position testing equipment in close proximity to the UUT in order to minimize signal loss, and the prior art solutions undesirably expose the entire test environment, including the beam, fixtures, tester, electronics, and cables, to the test temperature. Advances in technology have increased the complexity and temperature sensitivity of testing equipment located within the centrifuge chamber.

This background discussion is intended to provide information related to the present invention which is not necessarily prior art.

SUMMARY

Embodiments address the above-described and other problems and limitations in the prior art by providing a system for controlling the test temperature of a UUT inside a centrifuge while minimizing the exposure of attendant testing equipment to the test temperature.

An embodiment of the present invention may provide a system for controlling the test temperature of a UUT inside a centrifuge while minimizing the exposure of attendant testing equipment to the test temperature. The system may include a barrier housing and a fixture. The barrier housing may be emplaced around the UUT and configured to create a close test environment within which the test temperature can be achieved and maintained by the introduction of a thermal medium, with the testing equipment located on an opposite side of the barrier housing and outside of the close test environment but still within the centrifuge. The fixture may be configured to negotiate the thermal medium from outside the centrifuge into the close test environment.

Another embodiment of the present invention may provide a system including a centrifuge, attendant testing equipment, a barrier housing, and a fixture. The centrifuge may include a chamber and may be configured to impose an acceleration force on a UUT located in the chamber. The attendant testing equipment may be located in the chamber and may be configured to test the UUT. The barrier housing may be emplaced around the UUT within the chamber and configured to control the test temperature of the UUT while minimizing an exposure of the attendant testing equipment to the test temperature. The barrier housing may create a close test environment within which the test temperature can be achieved and maintained by the introduction of a thermal medium, with the testing equipment located on an opposite side of the barrier housing and outside of the close test environment but still within the chamber. The fixture may be configured to negotiate the thermal medium from outside the centrifuge into the close test environment.

Various implementations of the above-described embodiments may include any one or more of the following features. The UUT may be a mechanical switch being tested to confirm proper opening and closing of the mechanical switch under an acceleration force imposed by the centrifuge. The attendant testing equipment may be located along a axis of rotation in order to minimize acceleration effects. The test temperature may be between negative fifty-five degrees Celsius and positive one hundred twenty-five degrees Celsius. The barrier housing may be a clamshell housing configured to open to fit around the UUT and then close to create the close test environment. The barrier housing may be thermally insulated. The thermal medium may be a gas or a fluid. The fixture may include a rotary joint through which the thermal medium moves into a central axis of the centrifuge, through a gimbal, and into the close test environment.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

Figure 1:
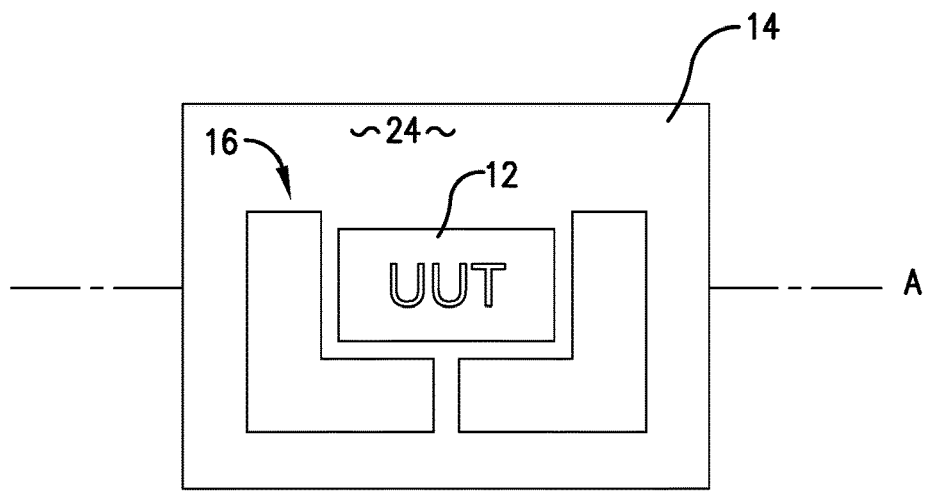
FIG. 1 is A cross-sectional elevation view of an embodiment of a system for controlling a test temperature of a UUT inside a centrifuge while minimizing an exposure of attendant testing equipment to the test temperature.

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. The embodiments of the invention are illustrated by way of example and not by way of limitation. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment," "an embodiment," or "embodiments" mean that the feature or features referred to are included in at least one embodiment of the invention. Separate references to "one embodiment," "an embodiment," or "embodiments" in this description do not necessarily refer to the same embodiment and are not mutually exclusive unless so stated. Specifically, a feature, component, action, step, etc. described in one embodiment may also be included in other embodiments, but is not necessarily included. Thus, particular implementations of the present invention can include a variety of combinations and/or integrations of the embodiments described herein.

Broadly characterized, embodiments provide a system for controlling a test temperature of a UUT inside a centrifuge while minimizing an exposure of attendant testing equipment to the test temperature. In more detail, embodiments may emplace a barrier housing around the UUT to create a close test environment within which the test temperature can be achieved and maintained, with the testing equipment located on the opposite side of the barrier housing and therefore outside of the close test environment but still within the centrifuge and in sufficiently close proximity to the UUT to, e.g., maintain signal quality. Thus, embodiments advantageously provide a more responsive and efficient design for controlling the temperature of the UUT, and advantageously allow temperature sensitive testing equipment to be used for testing a wider range of UUTs.

Broadly, the centrifuge may include a chamber and may be configured to impose an acceleration force on the UUT located in the chamber. An example UUT may be a mechanical switch being tested to confirm proper opening and closing under the acceleration force imposed by the centrifuge. Testing may include electrical and mechanical tests. In one implementation, the attendant testing equipment may be located relatively close to the axis of rotation in order to minimize acceleration effects on the attendant testing equipment. The test temperature range may depend on the nature of and application for the UUT. An example test temperature range may be approximately between negative fifty-five degrees Celsius and positive one hundred twenty-five degrees Celsius.

The barrier housing effectively minimizes the footprint of the temperature-controlled close test environment during the test so as not to require other equipment, such as the attendant testing equipment, within the centrifuge chamber to be exposed to the same temperature. In one implementation, the barrier housing may take the general form of a clamshell housing configured to open to fit around the UUT and then close to create the close test environment. The barrier housing may be thermally insulated to better maintain the internal test temperature and the external temperature. The temperature of the UUT may be controlled using a fixture configured to negotiate the introduction of a thermal medium (e.g., a gas or fluid) from an external reservoir into the close test environment. The fixture may be a three-dimensional printed device. In one implementation, the fixture may include a rotary joint in which the thermal medium moves into a central axis of the centrifuge, through a gimbal, and into the close test environment. A spinning rotary joint may allow for the plumbing of the thermal medium from outside the chamber to the fixture holding the UUT while spinning inside the centrifuge.

Figure 2:
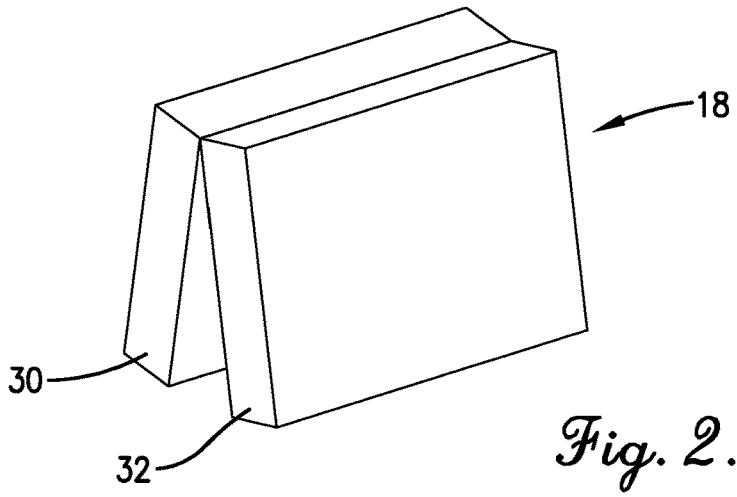
FIG. 2 is a perspective view of an example implementation of a barrier housing component of the system of FIG. 1, wherein the barrier housing is shown in the form of a clamshell housing which is shown in an open position.
Figure 3:
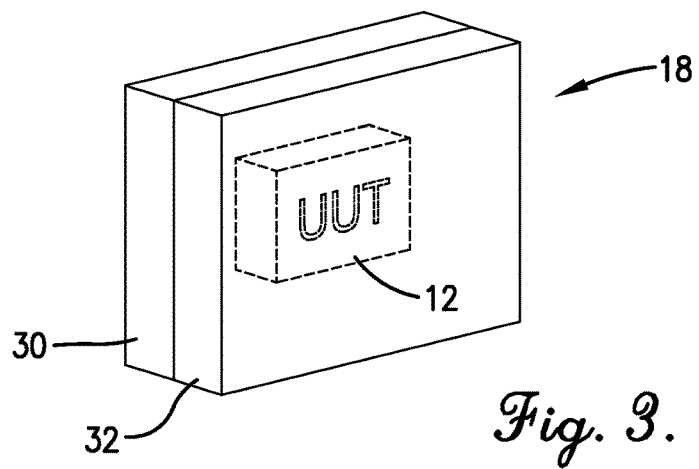
FIG. 3 is a perspective view of the example implementation of the barrier housing component of FIG. 2, wherein the clamshell housing is shown in a closed position defining a close test environment with the UUT (shown in broken line) inside.
Figure 4:
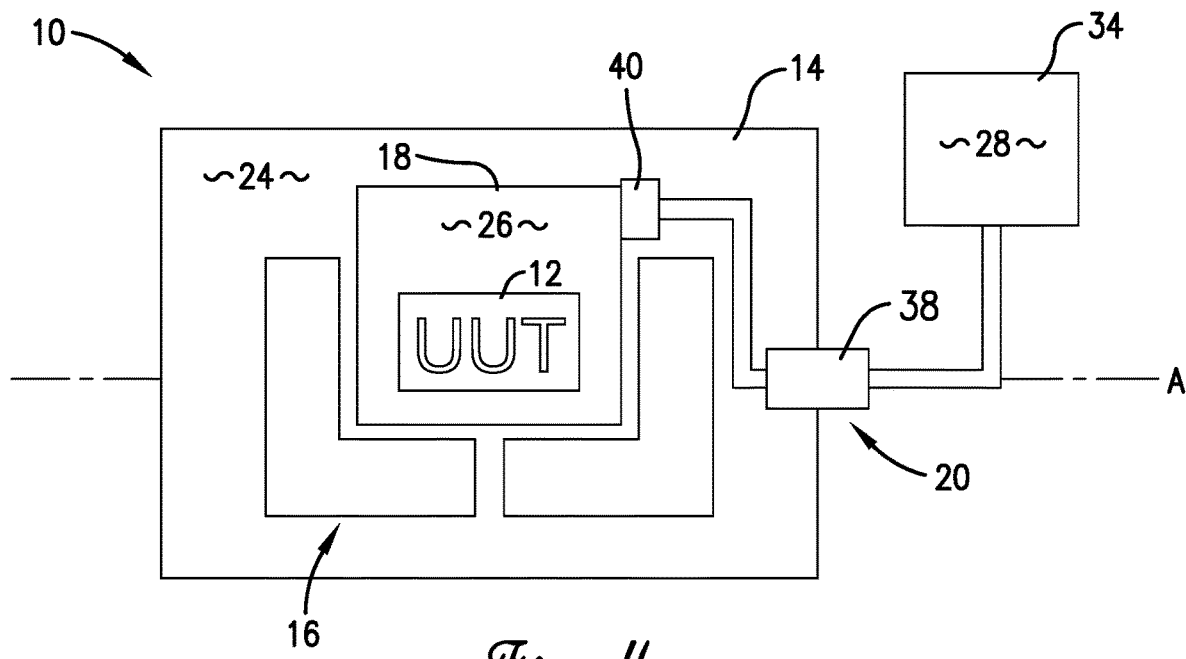
FIG. 4 is a cross-sectional elevation view of the system of FIG. 1 with the barrier housing emplaced around the UUT.
Figure 5:
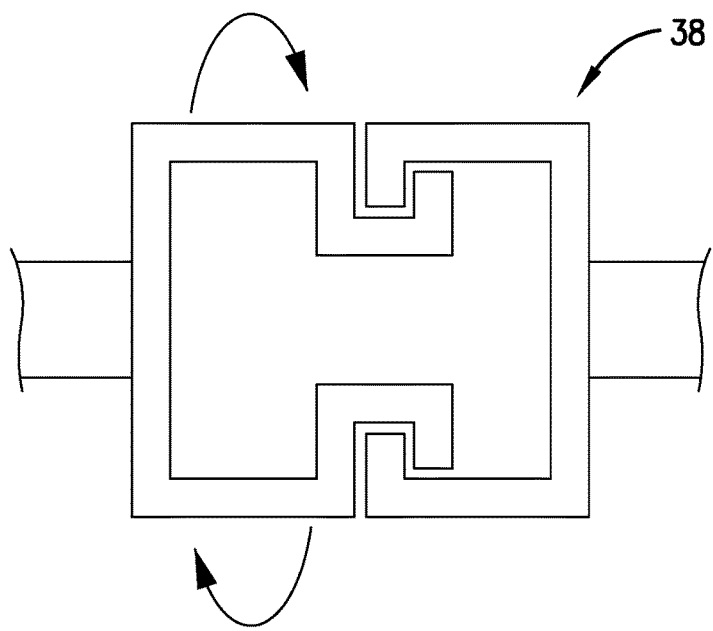
FIG. 5 is a cross-sectional elevation view of an embodiment of a rotary joint component of a fixture component of the system of FIG. 1, wherein the fixture component negotiates the introduction of a thermal medium into the close test environment.

Referring to FIGS. 1-5, an embodiment is shown of a system 10 for controlling the test temperature of a UUT 12 inside a centrifuge 14 while minimizing the exposure of attendant testing equipment 16 to the test temperature. The system 10 and its operating environment may include the centrifuge 14, the attendant testing equipment 16, a barrier housing 18, and a fixture 20. In one example application, the UUT 12 may be a mechanical switch being tested to confirm proper opening and closing under an acceleration force imposed by the centrifuge 14. In one implementation, the test temperature may be approximately between negative fifty-five degrees Celsius and positive one hundred twenty-five degrees Celsius.

The centrifuge 14 may include a chamber 24, and may be configured to impose an acceleration force on the UUT 14 located in the chamber 24. The attendant testing equipment 16 may also be located in the chamber 14, and may be configured to mechanically and/or electronically test the UUT 12. In one implementation, the attendant testing equipment 16 may be located along an axis A of rotation of the centrifuge 14 order to minimize acceleration effects.

The barrier housing 18 may be emplaced around the UUT 12 within the chamber 24, and may be configured to control the test temperature of the UUT 12 while minimizing an exposure of the attendant testing equipment 16 to the test temperature. In more detail, the barrier housing 18 may create a close test environment 26 within which the test temperature can be achieved and maintained by the introduction of a thermal medium 28, with the testing equipment 16 being located on an opposite side of the barrier housing 18 and outside of the close test environment 26 but still within the chamber 24. In one implementation, the barrier housing 18 may be a clamshell housing including at least first and second cooperating pieces 30,32 configured to open to fit around the UUT 12 and then close to create the close test environment 26. In one implementation, the barrier housing 18 may be thermally insulated.

The fixture 20 may be configured to negotiate the thermal medium 28 from a reservoir 34 located outside the centrifuge 14 into the close test environment 26 to achieve and maintain the test temperature. In various implementations, the thermal medium 28 may be a gas or a fluid. The fixture 20 may include a rotary joint 38 through which the thermal medium 28 moves into the central axis A of the centrifuge 14, through a gimbal 40, and into the close test environment 26.

It will be appreciated that embodiments of the present invention may be adapted to the particular UUT, the particular nature of the testing, and other application-specific considerations. In particular, the design, including the shape, operation, and material, of the barrier housing may change.

In operation, the system 10 may be employed and function as follows. The UUT 12 may be positioned in the chamber 24 in the centrifuge 14 and connected or otherwise operationally coupled with the attendant test equipment 16. The barrier housing 18 may be opened and the first and second cooperating pieces 30,32 fitted and closed around the UUT 12 to create the close test environment 26. The plumbing for the thermal medium 28 may be connected to the barrier housing 18. The fixture 20 may negotiate the transfer of the thermal medium 28 from the reservoir 34 to the close test environment 26 so as to achieve and maintain the test temperature within the close test environment 26. The centrifuge 14 may be activated and the attendant test equipment 16, which remains outside the close test environment 26 and the test temperature, may test the UUT 12 as desired or necessary.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. A system for controlling the test temperature of a unit-under-test inside a centrifuge while minimizing the exposure of attendant testing equipment to the test temperature, the system comprising:
    a barrier housing emplaced around the unit-under-test and configured to create a close test environment within which the test temperature can be achieved and maintained by the introduction of a thermal medium, with the testing equipment being located on an opposite side of the barrier housing and outside of the close test environment but still within the centrifuge,
    wherein the barrier housing is a clamshell housing configured to open to fit around the unit-under-test and then close to create the close test environment; and
    a fixture configured to negotiate the thermal medium from outside the centrifuge into the close test environment.

2. The system of claim 1, wherein the attendant testing equipment is located along an axis of rotation of the centrifuge in order to minimize acceleration effects on the attendant testing equipment.

3. The system of claim 1, wherein the test temperature is between negative fifty-five degrees Celsius and positive one hundred twenty-five degrees Celsius.

4. The system of claim 1, wherein the barrier housing is thermally insulated.

5. The system of claim 1, wherein the thermal medium is a gas.

6. The system of claim 1, wherein the thermal medium is a fluid.

7. The system of claim 1, wherein the fixture includes a rotary joint in which the thermal medium moves into a central axis of the centrifuge, through a gimbal, and into the close test environment.

8. A system for controlling the test temperature of a unit-under-test inside a centrifuge while minimizing the exposure of attendant testing equipment to the test temperature, the system comprising:
    a barrier housing emplaced around the unit-under-test and configured to create a close test environment within which the test temperature can be achieved and maintained by the introduction of a thermal medium, with the testing equipment being located on an opposite side of the barrier housing and outside of the close test environment but still within the centrifuge,
    wherein the barrier housing is a thermally insulated clamshell housing configured to open to fit around the unit-under-test and then close to create the close test environment; and
    a fixture configured to negotiate the thermal medium from outside the centrifuge into the close test environment, wherein the fixture includes a rotary joint in which the thermal medium moves into a central axis of the centrifuge, through a gimbal, and into the close test environment,
    wherein the test temperature is between negative fifty-five degrees Celsius and positive one hundred twenty-five degrees Celsius.

9. The system of claim 8, wherein the unit-under-test is a mechanical switch, and the mechanical switch is tested is to confirm proper opening and closing under an acceleration force imposed by the centrifuge.

10. The system of claim 8, wherein the attendant testing equipment is located along an axis of rotation of the centrifuge in order to minimize acceleration effects on the attendant testing equipment.

11. A system comprising:
    a centrifuge including a chamber and configured to impose an acceleration force on a unit-under-test located in the chamber,
    wherein the unit-under-test is a mechanical switch tested to confirm proper opening and closing under an acceleration force imposed by the centrifuge;
    an attendant testing equipment located in the chamber and configured to test the unit-under-test;
    a barrier housing emplaced around the unit-under-test within the chamber and configured to control the test temperature of the unit-under-test while minimizing an exposure of the attendant testing equipment to the test temperature,
    the barrier housing creating a close test environment within which the test temperature can be achieved and maintained by the introduction of a thermal medium, with the testing equipment being located on an opposite side of the barrier housing and outside of the close test environment but still within the chamber; and
    a fixture configured to negotiate the thermal medium from outside the centrifuge into the close test environment.

12. The system of claim 11, wherein the attendant testing equipment is located along an axis of rotation of the centrifuge in order to minimize acceleration effects on the attendant testing equipment.

13. The system of claim 11, wherein the test temperature is between negative fifty-five degrees Celsius and positive one hundred twenty-five degrees Celsius.

14. The system of claim 11, wherein the barrier housing is a clamshell housing configured to open to fit around the unit-under-test and then close to create the close test environment.

15. The system of claim 11, wherein the barrier housing is thermally insulated.

16. The system of claim 11, wherein the thermal medium is a gas.

17. The system of claim 11, wherein the thermal medium is a fluid.

18. The system of claim 11, wherein the fixture includes a rotary joint in which the thermal medium moves into a central axis of the centrifuge, through a gimbal, and into the close test environment.

19. A system for controlling the test temperature of a unit-under-test inside a centrifuge while minimizing the exposure of attendant testing equipment to the test temperature, the system comprising:
    a barrier housing emplaced around the unit-under-test and configured to create a close test environment within which the test temperature can be achieved and maintained by the introduction of a thermal medium, with the testing equipment being located on an opposite side of the barrier housing and outside of the close test environment but still within the centrifuge; and
    a fixture configured to negotiate the thermal medium from outside the centrifuge into the close test environment, the fixture including a rotary joint in which the thermal medium moves into a central axis of the centrifuge, through a gimbal, and into the close test environment.

20. A system comprising:
a centrifuge including a chamber and configured to impose an acceleration force on a unit-under-test located in the chamber;
an attendant testing equipment located in the chamber and configured to test the unit-under-test;
a barrier housing emplaced around the unit-under-test within the chamber and configured to control the test temperature of the unit-under-test while minimizing an exposure of the attendant testing equipment to the test temperature,
wherein the barrier housing is a clamshell housing configured to open to fit around the unit-under-test and then close to create the close test environment within which the test temperature can be achieved and maintained by the introduction of a thermal medium, with the testing equipment being located on an opposite side of the barrier housing and outside of the close test environment but still within the chamber; and
a fixture configured to negotiate the thermal medium from outside the centrifuge into the close test environment.

21. A system comprising:
a centrifuge including a chamber and configured to impose an acceleration force on a unit-under-test located in the chamber;
an attendant testing equipment located in the chamber and configured to test the unit-under-test;
a barrier housing emplaced around the unit-under-test within the chamber and configured to control the test temperature of the unit-under-test while minimizing an exposure of the attendant testing equipment to the test temperature,
the barrier housing creating a close test environment within which the test temperature can be achieved and maintained by the introduction of a thermal medium, with the testing equipment being located on an opposite side of the barrier housing and outside of the close test environment but still within the chamber; and
a fixture configured to negotiate the thermal medium from outside the centrifuge into the close test environment, the fixture including a rotary joint in which the thermal medium moves into a central axis of the centrifuge, through a gimbal, and into the close test environment.

* * * * *